(12) United States Patent
Kang et al.

(10) Patent No.: US 12,745,584 B2
(45) Date of Patent: Sep. 22, 2026

(54) MODULARIZED BONDING APPARATUS

(71) Applicant: HANWHA PRECISION MACHINERY CO., LTD., Changwon-si (KR)

(72) Inventors: Tae Woo Kang, Changwon-si (KR); Ho Joon Shin, Changwon-si (KR)

(73) Assignee: HANWHA PRECISION MACHINERY CO., LTD., Changwon-si (KR)

( * ) Notice: Subject to any disclaimer, the term of this patent is extended or adjusted under 35 U.S.C. 154(b) by 1072 days.

(21) Appl. No.: 17/889,933

(22) Filed: Aug. 17, 2022

(65) Prior Publication Data

US 2023/0092257 A1 Mar. 23, 2023

(30) Foreign Application Priority Data

Sep. 23, 2021 (KR) ........................ 10-2021-0125873

(51) Int. Cl.
*H10P 72/00* (2026.01)
*H10P 72/30* (2026.01)

(52) U.S. Cl.
CPC ...... *H10P 72/0414* (2026.01); *H10P 72/0434* (2026.01); *H10P 72/3302* (2026.01)

(58) Field of Classification Search
CPC ............. H10P 72/0414; H10P 72/0434; H10P 72/3302; H10P 72/0442; H10P 72/0461; H10P 72/0464; H10P 72/0446; H10P 72/0431; H10P 72/0452; H10P 72/0468; H10P 72/3408
See application file for complete search history.

(56) References Cited

U.S. PATENT DOCUMENTS 9,842,823 B2 12/2017 Yu et al.
2004/0211665 A1* 10/2004 Yoon ................ H01L 21/28556 257/E21.17

(Continued)

FOREIGN PATENT DOCUMENTS

JP 4989398 B2 8/2012
KR 10-0936778 B1 1/2010

(Continued)

OTHER PUBLICATIONS

Communication dated Jul. 18, 2023 issued by the Korean Intellectual Property Office in counterpart Korean Application No. 10-2021-0125873.

*Primary Examiner* — Tiffany T Tran
(74) *Attorney, Agent, or Firm* — Sughrue Mion, PLLC

(57) ABSTRACT

Provided is a bonding apparatus including a first wafer supplier including a plurality of load ports configured to store wafers having different sizes, the wafers including a plurality of substrate wafers and a plurality of die supply wafers, a first transferer adjacent to the first wafer supplier and configured to transfer the wafers, a first bonding device and a second bonding device facing the first wafer supplier, and configured to receive the wafers from the first wafer supplier and perform bonding, and a first cleaner comprising a plurality of cleaning areas, each of which is configured to receive the plurality of substrate wafers and the plurality of die supply wafers by the first transferer, and clean the plurality of substrate wafers and the plurality of die supply wafers.

18 Claims, 7 Drawing Sheets

(56) References Cited

U.S. PATENT DOCUMENTS

| | | | | |
|---|---|---|---|---|
| 2006/0266792 | A1* | 11/2006 | Ko | H01L 21/67144 257/E21.705 |
| 2022/0052017 | A1* | 2/2022 | Saegusa | H01L 21/6836 |
| 2022/0262653 | A1* | 8/2022 | Harris | H01L 21/6719 |
| 2022/0344196 | A1* | 10/2022 | Baek | H01L 21/68728 |

FOREIGN PATENT DOCUMENTS

| | | | |
|---|---|---|---|
| KR | 10-2014-0133534 | A | 11/2014 |
| KR | 10-2016-0082920 | A | 7/2016 |
| KR | 10-2020-0072976 | A | 6/2020 |
| KR | 10-2182791 | B1 | 11/2020 |
| KR | 10-2021-0087200 | A | 7/2021 |
| WO | 2013/120054 | A1 | 8/2013 |
| WO | 2015/043624 | A1 | 4/2015 |

* cited by examiner

MODULARIZED BONDING APPARATUS

CROSS-REFERENCE TO RELATED APPLICATION

This application claims priority to Korean Patent Application No. 10-2021-0125873, filed on Sep. 23, 2021, in the Korean Intellectual Property Office, the disclosure of which is incorporated by reference herein in its entirety.

BACKGROUND

1. Field

Embodiments of the disclosure relate to a bonding apparatus, and more particularly, to a bonding apparatus including one or more modules.

2. Description of Related Art

A bonding process is a process of bonding a wafer chip and a substrate in a semiconductor manufacturing process. Bonding methods include die bonding for directly attaching a front surface of a die to a substrate, wire bonding using a wire, flip chip bonding for forming bumps on a rear surface of a chip and connecting the chip to a substrate, thermo-compression bonding for individually peeling off a semiconductor chip on a wafer substrate, turning over the semiconductor chip, applying flux to bumps, and then pressing the semiconductor chip on the substrate, etc. Recently, hybrid bonding in which primary bonding is performed between silicon dioxide ($SiO_2$) layers by using van der Waals force, and copper-copper (Cu—Cu) secondary bonding is performed by using thermal expansion of a copper element filled in a via hole by applying heat at a high temperature through an annealing process is being used.

Because there are no protruding bumps in a Cu—$SiO_2$ hybrid bonding process, wafers may be stacked in more layers while maintaining the same semiconductor package height. For example, currently, wafers may be stacked up to 16 layers based on a thin die having a thickness of 25 um. However, in a semiconductor assembly process in which wafers are stacked up to 16 layers, a wafer logistics flow is very complicated, and the productivity of the entire packaging process may be lowered depending on a wafer transportation and standby time.

SUMMARY

The disclosure is directed to a bonding apparatus which may be modularized to respond to wafers of various sizes and shapes and may quickly perform the entire process.

However, the objective of disclosure is not limited thereto.

Additional aspects will be set forth in part in the description which follows and, in part, will be apparent from the description, or may be learned by practice of the presented embodiments of the disclosure.

According to an aspect of an embodiment, there is provided a bonding apparatus including a first wafer supplier including a plurality of load ports configured to store wafers having different sizes, the wafers including a plurality of substrate wafers and a plurality of die supply wafers, a first transferer adjacent to the first wafer supplier and configured to transfer the wafers, a first bonding device and a second bonding device facing the first wafer supplier, and configured to receive the wafers from the first wafer supplier and perform bonding, and a first cleaner comprising a plurality of cleaning areas, each of which is configured to receive the plurality of substrate wafers and the plurality of die supply wafers by the first transferer, and clean the plurality of substrate wafers and the plurality of die supply wafers.

Each of the first bonding device and the second bonding device may include a bonder configured to bond dies from the plurality of die supply wafers to the plurality of substrate wafers, respectively, and a pre-annealing oven configured to pre-anneal the plurality of bonded substrate wafers, and wherein the first transferer may be configured to transfer the plurality of pre-annealed substrate wafers to an annealing chamber for secondary annealing.

The first transferer may include a first mobile robot and a second mobile robot corresponding to the first bonding device and the second bonding device, respectively, when a bonder included in the first bonding device performs a bonding process, the second mobile robot may be configured to transfer the plurality of substrate wafers to a pre-annealing oven included in the second bonding device, and when the first mobile robot transfers the plurality of substrate wafers to a pre-annealing oven of the first bonding device, a bonder included in the second bonding device may be configured to perform the bonding process.

The bonding apparatus may further include a pretreatment device between the first bonding device and the second bonding device, the pretreatment device being configured to pretreat and activate the plurality of substrate wafers.

The first wafer supplier may be on a first side of the bonding apparatus with respect to the first transferer, and the first bonding device and the second bonding device may be on a second side of the bonding apparatus opposite to the first side, the bonding apparatus may further include a second transferer spaced apart from the first transferer, the second transferer including a mobile robot connected to mobile robots included in the first transferer, the first cleaner may be on a first side with respect to the second transferer, and the bonding apparatus may further include a second wafer supplier facing the first cleaner and including a plurality of load ports configured to store the plurality of substrate wafers and the plurality of die supply wafers having different sizes.

The bonding apparatus may further include a pretreatment device adjacent to the first cleaner and facing the second wafer supplier, and may be configured to pretreat and activate the plurality of bonded substrate wafers.

The first transferer may be configured to transfer the plurality of substrate wafers bonded by the first bonding device and the second bonding device to the second transferer, the second transferer may be configured to transfer the plurality of substrate wafers to the pretreatment device and a second cleaner, sequentially perform pretreatment and cleaning, and transfer the plurality of substrate wafers to the first transferer, and the first transferer may be configured to stack the plurality of pretreated and cleaned substrate wafers on the first wafer supplier in a plurality of layers.

The first wafer supplier and the first cleaner may be on a first side of the bonding apparatus with respect to the first transferer, the bonding apparatus may further include a second wafer supplier facing the first wafer supplier with the first cleaner therebetween, the second wafer supplier including a plurality of load ports configured to store the plurality of substrate wafers and the plurality of die supply wafers having different sizes, the first bonding device may face the first wafer supplier with respect to the first transferer, and the second bonding device may face the second wafer supplier with respect to the first transferer.

In each of the first wafer supplier and the second wafer supplier, a number of load ports configured to store the plurality of die supply wafers may be greater than a number of load ports configured to store the plurality of substrate wafers.

The bonding apparatus may further include a pretreatment device between the first bonding device and the second bonding device, the pretreatment device being configured to pretreat and activate the plurality of bonded substrate wafers, a first maintenance area in which the first bonding device is spaced apart from the pretreatment device by a predetermined distance, and a second maintenance area in which the second bonding device is spaced apart from the pretreatment device by a predetermined distance.

According to another aspect of an embodiment, there is provided a bonding apparatus including a first wafer supplier including a plurality of load ports configured to store wafers having different sizes, the wafers including a plurality of substrate wafers and a plurality of die supply wafers, a first transferer adjacent to the first wafer supplier and configured to transfer the wafers, a first bonding device and a second bonding device facing the first wafer supplier, and configured to receive the wafers from the first wafer supplier and perform bonding, a first cleaner comprising a plurality of cleaning areas, each of which is configured to receive the plurality of substrate wafers and the plurality of die supply wafers by the first transferer, and clean the plurality of substrate wafers and the plurality of die supply wafers, and a second wafer supplier facing the first cleaner and including a plurality of load ports configured to store the plurality of substrate wafers and the plurality of die supply wafers having different sizes.

Each of the first bonding device and the second bonding device may include a bonder configured to bond dies from the plurality of die supply wafers to the plurality of substrate wafers, respectively, and a pre-annealing oven configured to pre-anneal the plurality of bonded substrate wafers, and wherein the first transferer may be configured to transfer the plurality of pre-annealed substrate wafers to an annealing chamber for secondary annealing.

The first transferer may include a first mobile robot and a second mobile robot corresponding to the first bonding device and the second bonding device, respectively, when a bonder included in the first bonding device performs a bonding process, the second mobile robot may be configured to transfer the plurality of substrate wafers to a pre-annealing oven included in the second bonding device, and when the first mobile robot transfers the plurality of substrate wafers to a pre-annealing oven of the first bonding device, a bonder included in the second bonding device may be configured to perform the bonding process.

The bonding apparatus may further include a pretreatment device between the first bonding device and the second bonding device, the pretreatment device being configured to pretreat and activate the plurality of substrate wafers.

The first wafer supplier may be on a first side of the bonding apparatus with respect to the first transferer, and the first bonding device and the second bonding device may be on a second side of the bonding apparatus opposite to the first side, the bonding apparatus may further include a second transferer spaced apart from the first transferer, the second transferer including a mobile robot connected to mobile robots included in the first transferer, the first cleaner may be on a first side with respect to the second transferer.

The bonding apparatus may further include a pretreatment device adjacent to the first cleaner and facing the second wafer supplier, and may be configured to pretreat and activate the plurality of bonded substrate wafers.

The first transferer may be configured to transfer the plurality of substrate wafers bonded by the first bonding device and the second bonding device to the second transferer, the second transferer may be configured to transfer the plurality of substrate wafers to the pretreatment device and a second cleaner, sequentially perform pretreatment and cleaning, and transfer the plurality of substrate wafers to the first transferer, and the first transferer may be configured to stack the plurality of pretreated and cleaned substrate wafers on the first wafer supplier in a plurality of layers.

The first wafer supplier and the first cleaner may be on a first side of the bonding apparatus with respect to the first transferer, the first bonding device may face the first wafer supplier with respect to the first transferer, and the second bonding device may face the second wafer supplier with respect to the first transferer.

In each of the first wafer supplier and the second wafer supplier, a number of load ports configured to store the plurality of die supply wafers may be greater than a number of load ports configured to store the plurality of substrate wafers.

The bonding apparatus may further include a pretreatment device between the first bonding device and the second bonding device, the pretreatment device being configured to pretreat and activate the plurality of bonded substrate wafers, a first maintenance area in which the first bonding device is spaced apart from the pretreatment device by a predetermined distance, and a second maintenance area in which the second bonding device is spaced apart from the pretreatment device by a predetermined distance.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 6 and 7 illustrate a bonding apparatus according to another embodiment of the disclosure.

DETAILED DESCRIPTION

Figure 1:
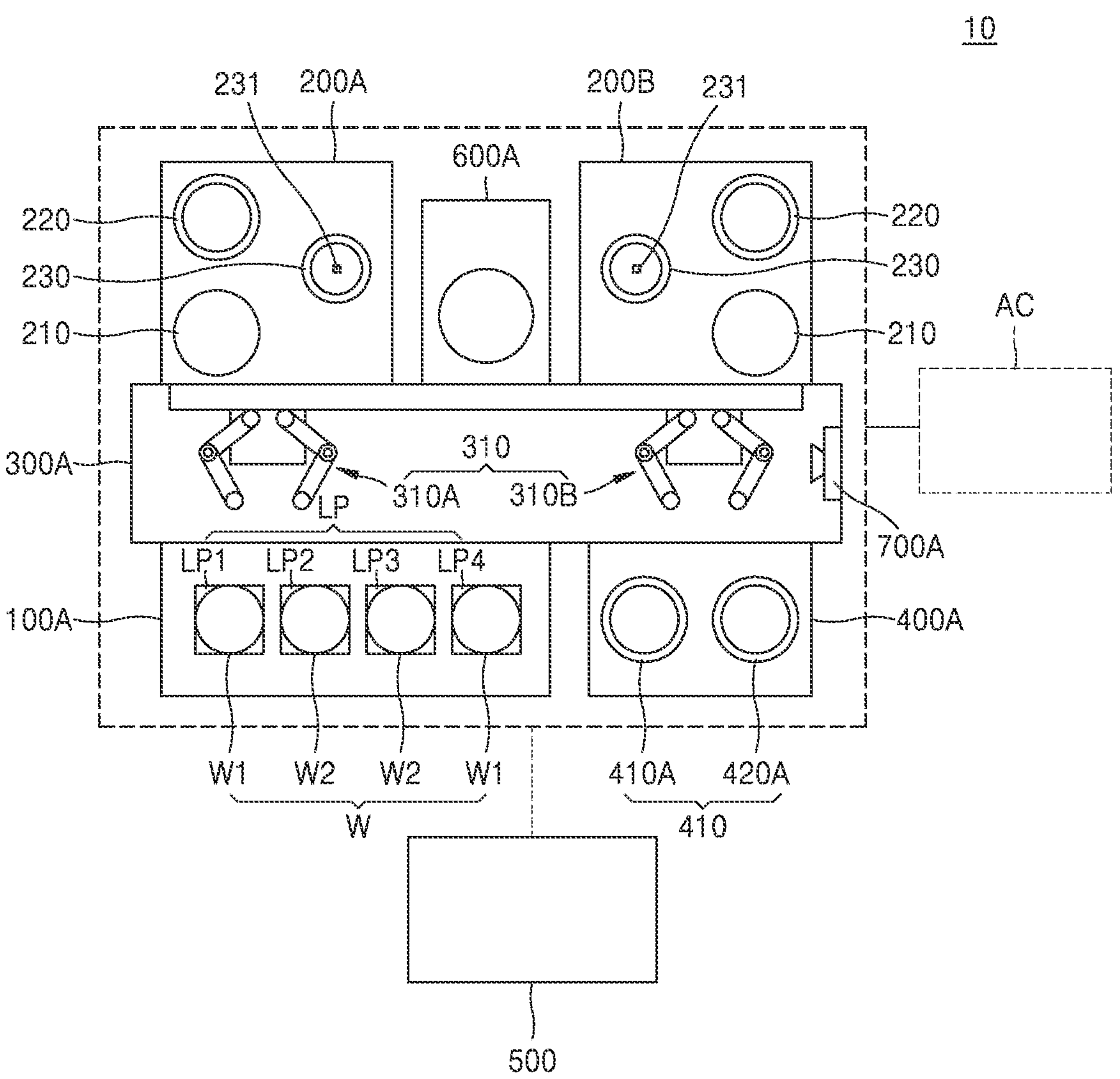
FIG. 1 illustrates a bonding apparatus according to an embodiment of the disclosure.

Reference will now be made in detail to embodiments, examples of which are illustrated in the accompanying drawings, wherein like reference numerals refer to like elements throughout. Embodiments described herein are example embodiments, and thus, the disclosure is not limited thereto. In this regard, the embodiments of the present disclosure may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

The disclosure may have various modifications and various embodiments, and specific embodiments are illustrated in the drawings and are described in detail in the detailed description. However, this is not intended to limit the disclosure to particular embodiments, and it will be understood that all changes, equivalents, and substitutes that do not depart from the spirit and technical scope of the disclosure are encompassed in the disclosure. In the description of the disclosure, even though elements are illustrated in other embodiments, like reference numerals are used to refer to like elements.

Hereinafter, embodiments of the disclosure will be described in detail with reference to the accompanying drawings, and in the following description with reference to the drawings, like reference numerals refer to like elements and redundant descriptions thereof will be omitted.

Although the terms "first," "second," etc. may be used to describe various elements, these elements should not be limited by these terms. These terms are only used to distinguish one element from another.

An expression used in the singular encompasses the expression of the plural, unless it has a clearly different meaning in the context.

It will be understood that the terms "comprise," "comprising," "include" and/or "including" as used herein specify the presence of stated features or elements but do not preclude the addition of one or more other features or elements.

Sizes of elements in the drawings may be exaggerated or reduced for convenience of explanation. In other words, because sizes and thicknesses of elements in the drawings are arbitrarily illustrated for convenience of explanation, the disclosure is not necessarily limited thereto.

The x-axis, the y-axis and the z-axis are not limited to three axes of the rectangular coordinate system, and may be interpreted in a broader sense. For example, the x axis, the y axis, and the z axis may be perpendicular to one another or may represent different directions that are not perpendicular to one another.

In the case where a certain embodiment may be implemented differently, a specific process order may be performed in the order different from the described order. As an example, two processes that are successively described may be substantially simultaneously performed or performed in the order opposite to the order described.

The terms used herein are only used to describe particular embodiments and are not intended to limit the scope of the disclosure. It will be understood that the terms "comprise," "comprising," "include" and/or "including" as used herein specify the presence of stated features, numbers, steps, operations, elements, parts, and combinations thereof, but do not preclude in advance the presence or addition of one or more other features, numbers, steps, operations, elements, parts, combinations thereof.

FIG. 1 illustrates a bonding apparatus 10 according to an embodiment of the disclosure, and FIGS. 2 to 5 illustrate a bonding process according to an embodiment of the disclosure.

According to an embodiment of the disclosure, the bonding apparatus 10 is an apparatus used for manufacturing a semiconductor wafer, and in more particularly, may be used for bonding semiconductor chips (or dies) to a substrate. A method by which the bonding apparatus 10 bonds dies to a substrate is not particularly limited. For example, the bonding apparatus 10 may perform a bonding process by using wire bonding, bumper bonding, flip chip bonding, or thermocompression bonding. In an embodiment, the bonding apparatus 10 may be an apparatus for performing copper-silicon dioxide (Cu—$SiO_2$) hybrid bonding.

Referring to FIG. 1, according to an embodiment of the disclosure, the bonding apparatus 10 may include a first wafer supplier 100A, a first bonding device 200A, a second bonding device 200B, a first transferer 300A, and a first cleaner 400A.

The first wafer supplier 100A may store a plurality of wafers W. In this case, the wafers W may include a die supply wafer W1 and a substrate wafer W2 of different sizes. Sizes and types of die supply wafers W1 and substrate wafers W2 are not particularly limited. For example, the die supply wafer W1 may be a wafer having a diameter of 300 mm, and the substrate wafer W2 may be a wafer having a diameter of 400 mm. In addition, the wafers W may be supplied from the outside of the bonding apparatus 10.

In an embodiment, the first wafer supplier 100A may include a load port LP for storing a plurality of wafers W different from each other. For example, the first wafer supplier 100A may include four load ports LP1, LP2, LP3, and LP4, and two of the load ports LP may be used to store the die supply wafers W1 and the other two load ports LP may be used to store the substrate wafers W2. However, the number of load ports LP does not need to be the same for the die supply wafers W1 and the substrate wafers W2, and the number of load ports LP may be appropriately adjusted.

The first bonding device 200A may be arranged to face the first wafer supplier 100A with respect to the first transferer 300A and may perform a bonding process by receiving the wafers W from the first wafer supplier 100A. For example, the first bonding device 200A may pick up a die D from the substrate wafer W2 while supporting the die supply wafer W1 on one side thereof, and bond the die D to the die supply wafer W1.

In an embodiment, the first bonding device 200A may include a picker 210, a bonder 220, and a pre-annealing oven 230.

Figure 3:
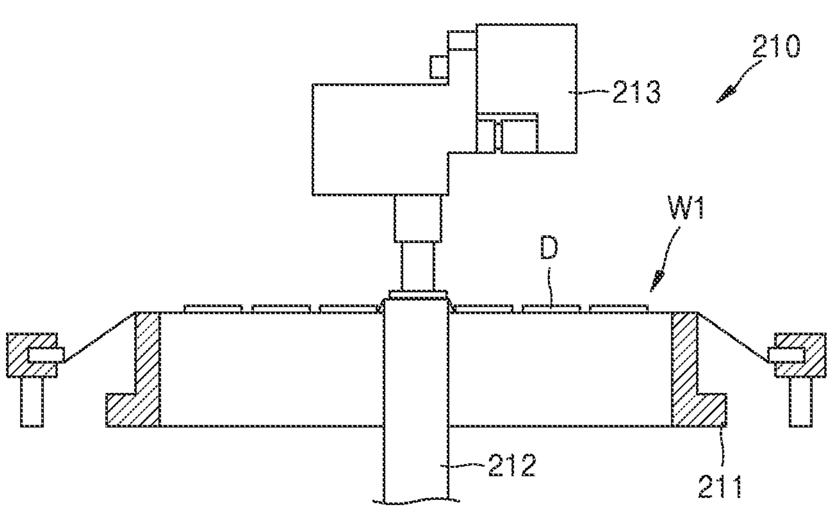

The picker 210 may pick up the die D from the die supply wafer W1. For example, as shown in FIG. 3, the picker 210 may include a supporter 211, an ejector 212, and a picking device 213. In this case, the die supply wafer W1 may have undergone a dicing process, and the dicing process may be performed by a separate apparatus provided outside the bonding apparatus 10. According to another embodiment, the bonding apparatus 10 may include a dicing apparatus.

The supporter 211 is a member supporting the die supply wafer W1 and may include a supporting device for supporting edges of the die supply wafer W1 and a fixing unit for fixing both ends of an adsorption member (e.g., a tape, etc.) that fixes the die D. A shape of the supporter 211 is not particularly limited, and any sizes may be sufficient for the supporter 211 to have a flat surface supporting the die supply wafer W1 on an upper surface thereof. In addition, the supporter 211 may have an empty space therein to enable the ejector 212 to move up and down.

Figure 4:
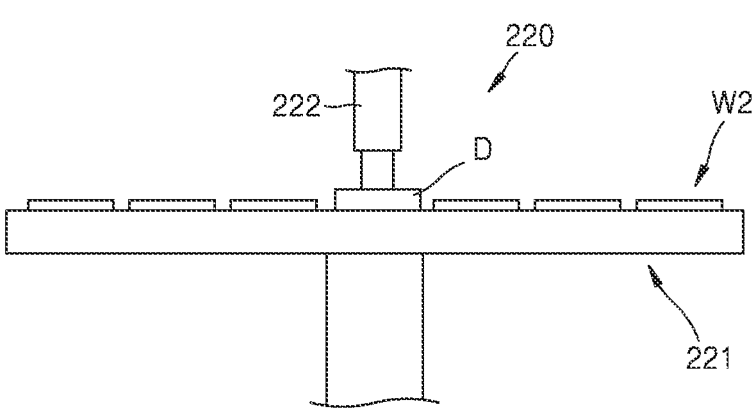

The ejector 212 moves up and down under the supporter 211 and presses the die D to be picked up. For example, as shown in FIG. 4, the ejector 212 is a rod-shaped member including a pressing device or a protrusion corresponding to a size of the die D, and presses the die D to be picked up, upward under the die D. Accordingly, the die D may be peeled off on the adsorption member.

The picking device 213 may support and pick up the die D peeled off by the ejector 212. For example, the picking device 213 may peel off the die D by adsorbing an upper surface of the die D though an adsorption hole.

The bonder 220 bonds the die D picked up by the picker 210 to the substrate wafer W2. For example, the bonder 220 may primarily bond the die D to the substrate wafer W2 by using van der Waals force between $SiO_2$ by pressing the die D on the substrate wafer W2.

In an embodiment, the bonder 220 may include a supporter 221 and a bonding device 222.

Similar to the supporter 211 of the picker 210, the supporter 221 may include a support surface on which the substrate wafer W2 is mounted. In an embodiment, the supporter 221 may rotate the substrate wafer W2 mounted on an upper surface thereof by rotating on a rotation axis.

The bonding device 222 presses the picked-up die D on the substrate wafer W2 while supporting the die D. For example, the bonding device 222 moves to a position to be bonded in the substrate wafer W2 while supporting the die D through an adsorption hole or a gripper, and then descends. Then, the bonding device 222 bonds the die D by pressing the substrate wafer W2 with a predetermined pressure.

In an embodiment, the bonding device 222 may be used in a hybrid bonding process. For example, hybrid bonding may be to a bonding method of simultaneously bonding a metal and an oxide or a metal and a polymer. When the bonding device 222 presses the die D on the substrate wafer W2, an oxide (e.g., $SiO_2$) on the substrate wafer W2 and an oxide (e.g., $SiO_2$) on the die D may be bonded to each other. In this case, the bond between the oxides may be a covalent bond by van der Waals force. In an embodiment, the bonding device 222 may press the die D under room temperature. Thereafter, when an annealing process is performed, dielectrics (e.g., Cu) of the substrate wafer W2 and the die D expand in a via hole and form a metal bond with each other.

In an embodiment, the bonding device 222 may perform a bonding process until dies D are bonded to all areas to be bonded on the substrate wafer W2. The pre-annealing oven 230 may be arranged to be spaced apart from the bonder 220 and may anneal the substrate wafer W2 to which the die D is primarily bonded by the bonder 220. For example, in a hybrid bonding process of the related art, an annealing process is performed by pressing a die on a substrate wafer, primarily bonding the die to the substrate wafer, and then stacking the same. However, during primary bonding, because the die and the substrate wafer are bonded only by covalent bonding between oxides, bonding force is relatively weak. Accordingly, there is a problem in that a chip fly phenomenon in which a bonded die is detached from a wafer during a stacking process, a transfer process, or an annealing process occurs.

According to an embodiment of the disclosure, in the bonding apparatus 10, the first bonding device 200A includes the pre-annealing oven 230 in order to solve such a problem. For example, the pre-annealing oven 230 may perform primary annealing on the substrate wafer W2, to which the die D is bonded by the bonder 220, before an annealing process is performed by an annealing chamber AC to be described below, and thus, chip fly may be prevented.

In an embodiment, the pre-annealing oven 230 may perform primary annealing at a predetermined temperature and for a predetermined time so that chip fly does not occur in subsequent processes after the primary annealing process is performed. For example, a temperature of the primary annealing performed by the pre-annealing oven 230 may be lower than a temperature of secondary annealing by the annealing chamber AC, and a time for the primary annealing may be shorter than a time for the secondary annealing. For example, the primary annealing may be performed at about 100° C. to 150° C. for about 5 minutes to about 10 minutes. According to another embodiment, the primary annealing may be performed at 120° C. for 10 minutes.

Through the configuration as described above, according to the embodiments of the disclosure, in the bonding apparatus 10, the die D is prevented from being detached from the substrate wafer W2 in subsequent processes after bonding, and thus, productivity may be increased.

In an embodiment, the pre-annealing oven 230 may include an inspection member 231. For example, as shown in FIG. 1, the inspection member 231 may be a member provided in the pre-annealing oven 230. In addition, the inspection member 231 may check mounting precision of the substrate wafer W2 or check the presence of foreign materials while the pre-annealing oven 230 performs the primary annealing process.

Through the configuration as described above, according to the embodiments of the disclosure, in the bonding apparatus 10, after the bonding process is performed by the bonder 220, the bonder 220 may not check the mounting precision or check the presence of foreign materials, but rather, such a process may be performed by the pre-annealing oven 230. Accordingly, the time required for the bonding process to be performed by the bonder 220 may be significantly reduced, and productivity may be increased by simultaneously performing the primary annealing process and the process of checking the mounting precision and checking the presence of foreign materials.

The type of inspection member 231 is not particularly limited, and a known inspection apparatus, such as a laser inspection apparatus, an optical inspection apparatus, or an ultrasonic inspection apparatus, may be used.

The second bonding device 200B may be arranged to be adjacent to the first bonding device 200A. For example, the second bonding device 200B may be arranged on one side of the bonding apparatus 10 with respect to the first transferer 300A and may be arranged to face the first bonding device 200A with respect to a first pretreatment device 600A. A configuration of the second bonding device 200B is the same as a configuration of the first bonding device 200A, and detailed descriptions thereof are omitted.

In an embodiment, when the bonding process is performed by the bonder 220 of the first bonding device 200A, the primary annealing process may be performed by a pre-annealing oven 230 of the second bonding device 200B. For example, each of the first bonding device 200A and the second bonding device 200B may include a picker 210, a bonder 220, and a pre-annealing oven 230. In addition, the bonder 220 included in the first bonding device 200A bonds the die D to the substrate wafer W2, the pre-annealing oven 230 included in the second bonding device 200B may primarily anneal the bonded substrate wafer W2. In this case, the bonding process and the primary annealing process may be performed simultaneously.

Through the configuration as described above, according to the embodiments of the disclosure, in the bonding apparatus 10, the first bonding device 200A and the second bonding device 200B simultaneously perform the bonding process and the primary annealing process, respectively, and thus, productivity may be further increased. For example, during the bonding process, the die supply wafer W1 stored in the first wafer supplier 100A may be used, and during the primary annealing process, the bonded substrate wafer W2 may be used. In this case, when the first bonding device 200A and the second bonding device 200B simultaneously perform the bonding process, there may be a case where the die supply wafers W1 stored in the first wafer supplier 100A are temporarily insufficient, and accordingly, the entire bonding process may be delayed.

According to the embodiments of the disclosure, in the bonding apparatus 10, the first bonding device 200A and the second bonding device 200B perform the bonding process or the primary annealing process, but by removing time for performing the bonding process and the primary annealing process from overlapping each other or significantly reducing an overlapping time, such a delay time may be reduced.

In an embodiment, the bonding process and the primary annealing process simultaneously performed by the first bonding device 200A and the second bonding device 200B may be completed simultaneously. For example, the time at which the bonding process is completed by the bonder 220 of the first bonding device 200A and the time at which the primary annealing process is completed by the pre-annealing oven 230 of the second bonding device 200B may be the same. Accordingly, the bonding process and the primary annealing process may be repeated without a time difference in the first bonding device 200A and the second bonding device 200B.

In an embodiment, when the bonding process is completed by the first bonding device 200A, the first bonding device 200A may perform the primary annealing process, and when the primary annealing process is completed, the first bonding device 200A may perform the bonding process again.

When the primary annealing process is completed, the first transferer 300A to be described below may stack the substrate wafers W2 in a plurality of layers. For example, the first transferer 300A may take out the substrate wafers W2 from the pre-annealing oven 230 and stack the substrate wafers W2 on the load port LP of the wafer supplier 100.

The first transferer 300A may transfer a wafer W between the plurality of chambers and transfer a bonded wafer W to the annealing chamber AC. For example, as shown in FIG. 1, the first transferer 300A may be between the first wafer supplier 100A and the first bonding device 200A.

In an embodiment, the first transferer 300A may include a plurality of mobile robots 310. Although FIG. 1 illustrates only a first mobile robot 310A and a second mobile robot 310B, the number of mobile robots is not limited thereto. The mobile robots 310 may move along rails of the first transferer 300A and may transfer the wafer W between the first wafer supplier 100A, the first bonding device 200A, the first cleaner 400A, and the first pretreatment device 600A according to each process.

In an embodiment, the first mobile robot 310A and the second mobile robot 310B of the first transferer 300A may correspond to the first bonding device 200A and the second bonding device 200B, respectively. In addition, when the bonder 220 of the first bonding device 200A performs the bonding process, the second mobile robot 310B may transfer the substrate wafer W2 to the pre-annealing oven 230 of the second bonding device 200B. In addition, when the first mobile robot 310A transfers the substrate wafer W2 to the pre-annealing oven 230 of the first bonding device 200A, the bonder 220 of the second bonding device 200B may perform the bonding process.

Figure 5:
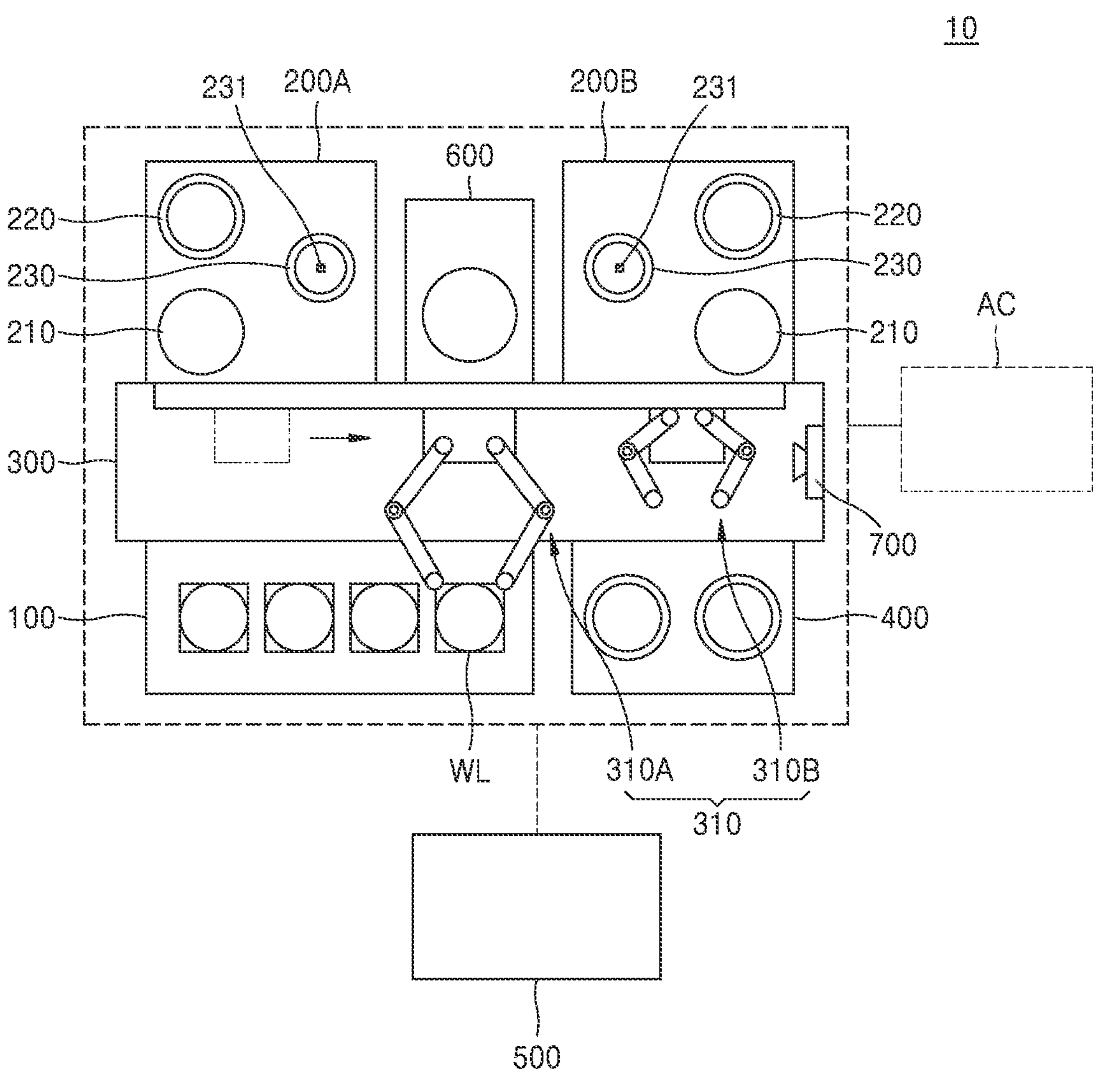

In an embodiment, as shown in FIG. 5, the first transferer 300A may stack the substrate wafers W2 on the load port LP of the first wafer supplier 100A in a plurality of layers. For example, the first transferer 300A may stack the substrate wafers W2 in 16 layers.

In an embodiment, the first transferer 300A may transfer the substrate wafers W2 to the annealing chamber AC. For example, as shown in FIG. 1, the first transferer 300A may transfer, to the annealing chamber AC, the substrate wafers W2 stacked on the first wafer supplier 100A in the plurality of layers. For example, the substrate wafers W2 may be stacked in 16 layers. In this case, the annealing chamber AC may be an annealing apparatus arranged outside the bonding apparatus 10.

The annealing chamber AC performs secondary annealing on the substrate wafers W2 stacked in the plurality of layers. In an embodiment, a secondary annealing temperature may be higher than a primary annealing temperature, and a secondary annealing time may be longer than a primary annealing time. For example, the secondary annealing temperature may be about 250° C. to about 350° C., and the secondary annealing time may be about 1 hour to about 3 hours. According to another embodiment, the secondary annealing temperature may be 300° C., and the secondary annealing time may be 2 hours.

Accordingly, the primarily annealed substrate wafers W2 are secondarily annealed in the annealing chamber AC, and metals (e.g., Cu) expand in a via hole, and accordingly, a strong bond between metals may be formed.

The first cleaner 400A may clean the wafer W. For example, as shown in FIG. 1, the first cleaner 400A may be arranged to be adjacent to the first wafer supplier 100A on the same side as the first wafer supplier 100A with respect to the first transferer 300A, and may also be arranged to face the first bonding device 200A. In addition, the first cleaner 400A may include a cleaning area 410 on which the wafer W is mounted during a cleaning process. In this case, the cleaning area 410 may be formed as a plurality of cleaning areas to correspond to different wafers W, for example, the die supply wafer W1 and the substrate wafer W2. For example, a first cleaning area 410A may correspond to the die supply wafer W1, and a second cleaning area 410B may correspond to the substrate wafer W2.

Figure 2:
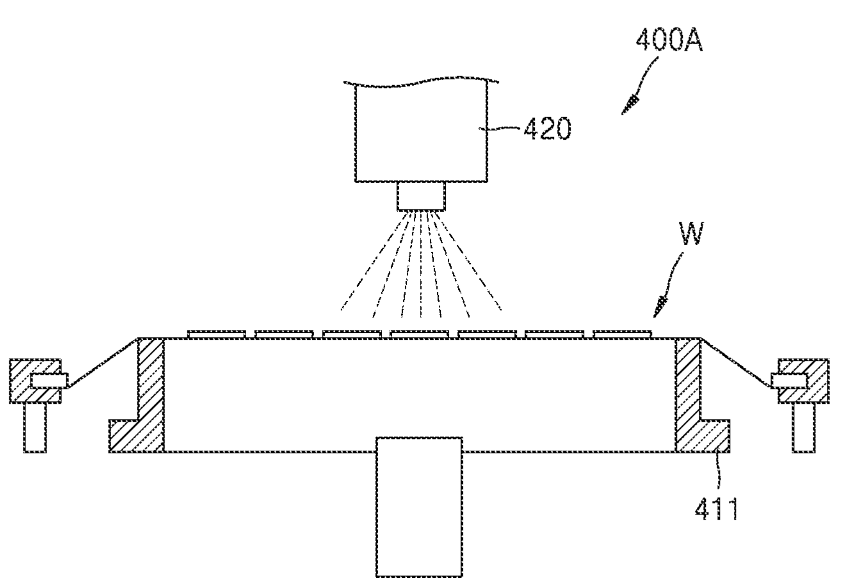
FIGS. 2, 3, 4, and 5 illustrate a bonding process according to an embodiment of the disclosure.

In an embodiment, the first cleaner 400A may include a spray nozzle 420. For example, as shown in FIG. 2, the first cleaner 400A may perform the cleaning process by spraying a cleaning fluid on the wafer W through the spray nozzle 420, the wafer W being supported by a supporter 411 provided in the cleaning area 410. In an embodiment, the cleaning fluid may be deionized water.

In an embodiment, the first cleaner 400A may be used to clean the die supply wafer W1 and the substrate wafer W2. For example, before the bonding process is performed by the bonding device 200, the first cleaner 400A may perform the cleaning process by receiving the die supply wafer W1 and/or the substrate wafer W2 from the first wafer supplier 100A. According to another embodiment, the first cleaner 400A may perform the cleaning process on the bonded and primarily annealed substrate wafer W2.

The first pretreatment device 600A may perform surface treatment on the wafer W. For example, as shown in FIG. 1, the first pretreatment device 600A may be arranged to be adjacent to the first bonding device 200A. For example, the first pretreatment device 600A may be between the first bonding device 200A and the second bonding device 200B. In an embodiment, the first pretreatment device 600A may activate the surface through plasma. In this case, the first pretreatment device 600A may perform pretreatment on the wafer W after cleaning or may perform pretreatment on the wafer W before cleaning.

In an embodiment, the first pretreatment device 600A may activate the surface by performing plasma treatment on the surface of the substrate wafer W2 cleaned by the first cleaner 400A.

In an embodiment, the first cleaner 400A and the first pretreatment device 600A may respectively perform a cleaning process and a pretreatment process on the primarily annealed substrate wafer W2. For example, when the primary annealing process is completed by the pre-annealing oven 230, the first transferer 300A may transfer the substrate wafer W2 to the first pretreatment device 600A and perform the pretreatment process. Next, the substrate wafer W2 is transferred to the first cleaner 400A by the first transferer 300A and cleaned, and the first transferer 300A stacks the substrate wafer W2 on the first wafer supplier 100A again.

A controller 500 may control other components of the bonding apparatus 10. For example, the controller 500 may be connected to other components, i.e., the first wafer supplier 100A, the first bonding device 200A, the first transferer 300A, the first cleaner 400A, the first pretreatment device 600A, and a first aligner 700A to be described below, included in the bonding apparatus 10, by wire or wirelessly and may control these components.

In an embodiment, the controller 500 may control the bonding process and the primary annealing process performed by the first bonding device 200A and the second bonding device 200B to be completed simultaneously. For example, the controller 500 may predict the time at which the bonding process is completed by the first bonding device 200A. For example, the controller 500 may predict the time at which the bonding process is completed by the first bonding device 200A, based on information regarding the time and distance that the picker 210 and the bonder 220 move, the time (pressing time) required for the bonder 220 to press the die D on the substrate wafer W2, a wafer map indicating the wafer quality of the substrate wafer W2, and the speeds and accelerations of other drivers.

The controller 500 may include a computing device such as a workstation computer, a desktop computer, a laptop computer, or a tablet computer. The controller may include a simple controller, a microprocessor, a complex processor such as a central processing unit (CPU) or a graphics processing unit (GPU), a processor configured by software, or dedicated hardware or firmware. For example, the controller and the processor may be implemented by a general-use computer or an application-specific hardware component such as a digital signal processor (DSP), a field programmable gate array (FPGA), or an application-specific integrated circuit (ASIC).

In addition, the controller 500 may control a primary annealing condition so that the primary annealing process is completed by the second bonding device 200B according to an expected bonding completion time. In particular, the controller 500 may calculate the expected bonding completion time again even while the bonding process and the primary annealing process are performed, and when an initially calculated first expected time is different from a re-calculated second expected time, may modify the primary annealing condition according to the second expected time. For example, when the second expected time is faster than the first expected time, the controller 500 may control the bonding process in the first bonding device 200A and the primary annealing process in the second bonding device 200B to be completed simultaneously, by reducing the time required, instead of increasing the temperature in the primary annealing process.

The first aligner 700A is arranged on one side of the first transferer 300A and senses a state in which the wafer W is gripped by the first transferer 300A in real time. The type of first aligner 700A is not particularly limited and may be an optical camera or a laser sensor. When the first aligner 700A senses that the wafer W is incorrectly gripped by the first transferer 300A, the first aligner 700A may transmit such information to the controller 500, and the controller 500 may control the operation of the first transferer 300A.

Figure 6:
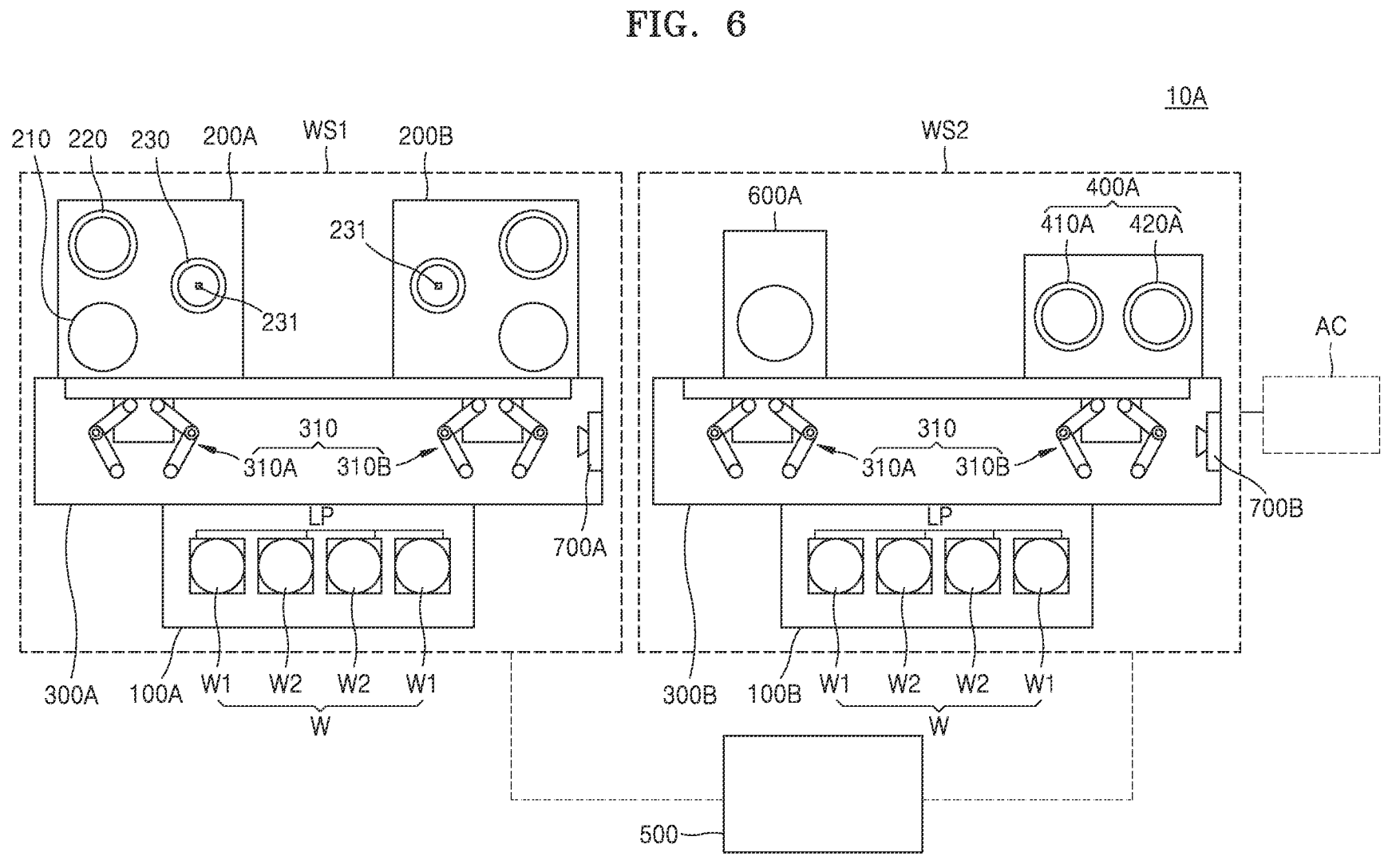

FIG. 6 illustrates a bonding apparatus 10A according to another embodiment of the disclosure.

Referring to FIG. 6, the bonding apparatus 10A may include a first wafer supplier 100A, a second wafer supplier 100B, a first bonding device 200A, a second bonding device 200B, a first transferer 300A, a second transferer 300B, a first cleaner 400A, a controller 500, a first pretreatment device 600A, a first aligner 700A, and a second aligner 700B.

Each configuration of FIG. 6 may have the same configuration as that of the bonding apparatus 10 according to the embodiment shown in FIG. 1, and hereinafter, differences will be mainly described.

As shown in FIG. 6, the first wafer supplier 100A is arranged on one side of the first transferer 300A, and the first bonding device 200A and the second bonding device 200B are arranged on the other side of the first transferer 300A to face the first wafer supplier 100A.

In addition, the second wafer supplier 100B is arranged on one side of the second transferer 300B, and the first cleaner 400A and the first pretreatment device 600A are arranged on the other side of the second transferer 300B to face the second wafer supplier 100B. In addition, the second transferer 300B may include mobile robots connected to the mobile robots of the first transferer 300A.

For example, the bonding apparatus 10A may be largely divided into two work areas WS, and a first work area WS1 may be an area in which a bonding process is performed. The first work area WS1 may include the first wafer supplier 100A, the first bonding device 200A, the second bonding device 200B, the first transferer 300A, and the first aligner 700A. In addition, a second work area WS2 may be an area in which cleaning and pretreatment processes are performed. The second work area WS2 may be arranged to be adjacent to the first work area WS1 and may include the second wafer supplier 100B, the second transferer 300B, the first cleaner 400A, the first pretreatment device 600A, and the second aligner 700B.

First, a wafer W is supplied from the outside to the first wafer supplier 100A. The first wafer supplier 100A may include a plurality of load ports LP, and a plurality of die supply wafers W1 and a plurality of substrate wafers W2 of different sizes may be stored in each of the load ports LP.

In an embodiment, the wafer W stored in the first wafer supplier 100A may have been cleaned and pretreated respectively by the first cleaner 400A and the first pretreatment device 600A. For example, before the bonding process is performed by the first bonding device 200A and the second bonding device 200B, the first transferer 300A transfers the wafer W to the second work area WS2 through the second transferer 300B. The second transferer 300B may store the received wafer W in the second wafer supplier 100B and transfer the wafer W to the first cleaner 400A and the first pretreatment device 600A according to the process. The wafer W on which the cleaning and pretreatment processes are completed may be stored again in the first wafer supplier 100A or transferred to the first bonding device 200A and the second bonding device 200B through the second transferer 300B and the first transferer 300A.

In addition, the mobile robots 310 of the first transferer 300A transfer the wafer W stored in the first wafer supplier 100A to the first bonding device 200A and the second bonding device 200B.

In an embodiment, the first bonding device 200A and the second bonding device 200B may pick up a die D from the die supply wafer W1 by using the picker 210, the bonder 220, and the pre-annealing oven 230, and may bond the die D on the substrate wafer W2 and then perform primary annealing. The process as described above may be the same as that of the bonding apparatus 10 described above, and detailed descriptions thereof are omitted.

When the bonding and primary annealing are completed, the first transferer 300A transfers the substrate wafer W2 to the second transferer 300B. For example, the first transferer 300A and the second transferer 300B are spaced apart from each other, but the mobile robots 310 respectively included in the first transferer 300A and the second transferer 300B may transmit and receive the wafer W to and from each other at ends adjacent to each other.

The second transferer 300B stores the received wafer W in the second wafer supplier 100B and transfers the wafer W to the first pretreatment device 600A and the first cleaner 400A according to the process. In an embodiment, after pretreatment is performed by the first pretreatment device 600A, the first cleaner 400A may perform cleaning.

When the pretreatment and cleaning are completed, the second transferer 300B stores the substrate wafer W2 in the second wafer supplier 100B or immediately transfers the substrate wafer W2 to the first transferer 300A. The first transferer 300A stores the substrate wafer W2 in the first wafer supplier 100A again.

In an embodiment, the first transferer 300A may stack the substrate wafers W2 on the first wafer supplier 100A in a plurality of layers. For example, the first transferer 300A may stack the substrate wafers W2 in 16 layers.

Next, the first transferer 300A transfers the substrate wafers W2 stacked in the plurality of layers to the second transferer 300B again, and the second transferer 300B transfers the substrate wafers W2 to the annealing chamber AC. The annealing chamber AC may perform secondary annealing on the stacked substrate wafers W2.

As described above, according to the embodiments of the disclosure, the bonding apparatus 10A is divided into separate work areas each including a transferer, and accordingly, productivity may be increased. In particular, in the bonding apparatus 10A, the first transferer 300A, the first bonding device 200A, and the second bonding device 200B are arranged in the first work area WS1, and the second transferer 300B, the first cleaner 400A, and the first pretreatment device 600A are arranged in the second work area WS2, and thus, the bonding process and the cleaning and pretreatment processes may be simultaneously performed in each work area.

Accordingly, because the bonding, cleaning, and pretreatment processes are simultaneously performed in one work area, a problem in which productivity decreases because a movement path of one transferer increases may be solved.

Figure 7:
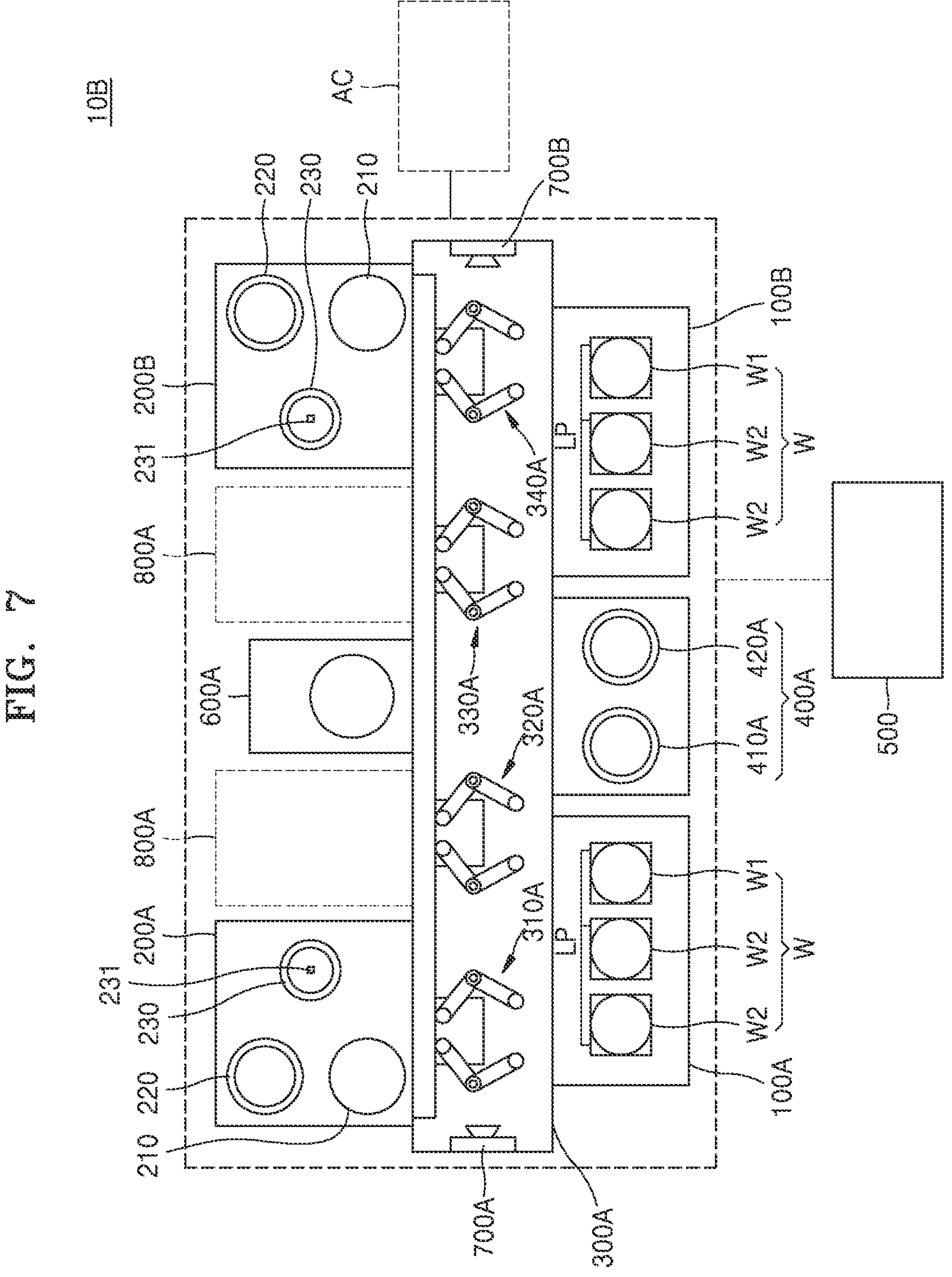

FIG. 7 illustrates a bonding apparatus 10B according to another embodiment of the disclosure.

Referring to FIG. 7, the bonding apparatus 10B may include a first wafer supplier 100A, a second wafer supplier 100B, a first bonding device 200A, a second bonding device 200B, a first transferer 300A, a first cleaner 400A, a controller 500, a first pretreatment device 600A, a first aligner 700A, a second aligner 700B, a first maintenance area 800A, and a second maintenance area 800B.

Each configuration of FIG. 7 may have the same configuration as that of the bonding apparatus 10 according to the embodiment shown in FIG. 1, and hereinafter, differences will be mainly described.

As shown in FIG. 7, the first wafer supplier 100A and the second wafer supplier 100B may be arranged on one side of the bonding apparatus 10B with respect to the first transferer 300A, and the first cleaner 400A may be therebetween. In addition, the first bonding device 200A may be arranged on an opposite side of the first wafer supplier 100A, and the second bonding device 200B may be arranged on an opposite side of the second wafer supplier 100B. In addition, the first pretreatment device 600A may be between the first bonding device 200A and the second bonding device 200B, the first maintenance area 800A may be between the first pretreatment device 600A and the first bonding device 200A, and the second maintenance area 800B may be between the first pretreatment device 600A and the second bonding device 200B. The bonding apparatus 10B may include one work area, and the first transferer 300A may extend along one line over the entire work area. In addition, the first transferer 300A may include four mobile robots 310A, 320A, 330A, and 340A.

First, wafers W are supplied from the outside to the first wafer supplier 100A and the second wafer supplier 100B. Each of the first wafer supplier 100A and the second wafer supplier 100B includes a plurality of load ports LP, and a plurality of die supply wafers W1 and a plurality of substrate wafers W2 of different sizes may be stored in each of the load ports LP.

In an embodiment, in the first wafer supplier 100A and the second wafer supplier 100B, the number of load ports LP for storing the die supply wafers W1 may be greater than the number of load ports LP for storing the substrate wafers W2. For example, as shown in FIG. 7, each of the first wafer supplier 100A and the second wafer supplier 100B may include one load port LP for storing the substrate wafers W2 and two load ports LP for storing the die supply wafers W1.

For example, the demand for the substrate wafers W2 is greater than that of the die supply wafers W1 due to the nature of the bonding process. Accordingly, the overall size of the bonding apparatus 10B may be reduced by reducing the number of load ports LP included in each wafer supplier, and a problem in which the bonding process is interrupted due to an insufficient number of wafers W may also be prevented by storing a larger number of die supply wafers W1 than the substrate wafers W2.

In an embodiment, the wafers W stored in the first wafer supplier 100A and the second wafer supplier 100B may have been cleaned and pretreated respectively by the first cleaner 400A and the first pretreatment device 600A. For example, before the bonding process is performed by the first bonding device 200A and the second bonding device 200B, the first transferer 300A may transfer the wafers W to the first cleaner 400A and the first pretreatment device 600A according to the process. The wafers W on which the cleaning and pretreatment process are completed may be stored in the first wafer supplier 100A or transferred to the first bonding device 200A and the second bonding device 200B through the first transferer 300A.

In addition, the mobile robots 310 of the first transferer 300A transfer the wafers W stored in the first wafer supplier 100A and the second wafer supplier 100B to the first bonding device 200A and the second bonding device 200B.

In an embodiment, the first bonding device 200A and the second bonding device 200B may pick up a die D from the die supply wafer W1 by using the picker 210, the bonder 220, and the pre-annealing oven 230, and may bond the die D on the substrate wafer W2 and then perform primary annealing. The process as described above may be the same as that of the bonding apparatus 10 described above, and detailed descriptions thereof are omitted.

When the bonding and primary annealing processes are completed by the first bonding device 200A and the second bonding device 200B, respectively, the first transferer 300A transfers the substrate wafer W2 to the first pretreatment device 600A. The first pretreatment device 600A may activate the surface of the substrate wafer W2 by using plasma, and the first transferer 300A transfers the substrate wafer W2 to the first cleaner 400A again. When cleaning is completed, the first transferer 300A stacks the substrate wafers W2 on the first wafer supplier 100A or the second wafer supplier 100B in a plurality of layers.

When the substrate wafers W2 are stacked in the plurality of layers (e.g., 16 layers) by repeating the operation as described above, the first transferer 300A transfers the stacked substrate wafers W2 to the annealing chamber AC. The annealing chamber AC performs secondary annealing on the stacked substrate wafers W2. In the embodiments of the disclosure, annealing in primary annealing or pre-annealing is different from annealing used in the related art, and is directed to a minimum thermal process to prevent a minimum number of stacked dies from being detached or moved between processes before performing secondary annealing.

The first maintenance area 800A is an area for maintaining and repairing other components of the bonding apparatus 10B, and in an embodiment, the first maintenance area 800A may be formed between the first bonding device 200A and the first pretreatment device 600A. For example, as shown in FIG. 7, the first bonding device 200A and the first pretreatment device 600A may be arranged to be spaced apart from each other by a predetermined distance, and the first maintenance area 800A may be arranged in a spaced area. A size of the first maintenance area 800A is not particularly limited, but the first maintenance area 800A may have a size sufficient to allow a worker or a working robot to be put in and perform operations of maintaining and repairing the first bonding device 200A, the first transferer 300A, and the first pretreatment device 600A.

Similarly, the second maintenance area 800B may be formed between the second bonding device 200B and the first pretreatment device 600A. A configuration of the second maintenance area 800B is the same as a configuration of the first maintenance area 800A, and thus, detailed descriptions thereof are omitted.

As described above, according to the embodiments of the disclosure, in the bonding apparatus 10B, two wafer suppliers and two bonding devices may be arranged around the first transferer 300A extending long along one line, and the first cleaner 400A and the first pretreatment device 600A may be between each wafer supplier and each bonding device. Accordingly, movement paths of the mobile robots 310A to 340A of the first transferer 300A may be significantly reduced, and productivity may be increased.

In addition, according to the embodiments of the disclosure, in the bonding apparatus 10B, because maintenance areas are included, various components, such as the first bonding device 200A, the second bonding device 200B, the first transferer 300A, and the first pretreatment device 600A, included in the bonding apparatus 10B may be more easily accessed, and maintained and repaired.

In another embodiment, a cleaner may include a second cleaner in addition to the first cleaner 400A. For example, referring to FIG. 7, the first cleaner 400A and the second cleaner may be between the first wafer supplier 100A and the second wafer supplier 100B.

In another embodiment, a pretreatment device may include a second pretreatment device in addition to the first pretreatment device 600A. For example, referring to FIG. 7, the first pretreatment device 600A and the second pretreatment device may be between the first bonding device 200A and the second bonding device 200B.

As described above, according to the embodiments of the disclosure, in the bonding apparatus 10, a wafer supplier, a bonding device, a transferer, a cleaner, a controller, a pretreatment device, an aligner, and a maintenance area are modularized and appropriately arranged, and thus, productivity may be increased by appropriately responding to process conditions or wafer sizes.

According to the embodiments of the disclosure, the bonding apparatus may be divided into separate work areas each including a transferer, and accordingly, productivity may be increased.

According to the embodiments of the disclosure, the bonding apparatus may significantly reduce a movement path of a transferer and increase productivity.

According to the embodiments of the disclosure, in the bonding apparatus, various components included in the bonding apparatus may be more easily accessed, and maintained and repaired.

According to the embodiments of the disclosure, in the bonding apparatus, a wafer supplier, a bonding device, a transferer, a cleaner, a controller, a pretreatment device, an aligner, and a maintenance area are modularized and appropriately arranged, and thus, productivity may be increased by appropriately responding to process conditions or wafer sizes.

As described above, the disclosure has been described with reference to the embodiment illustrated in the drawings, but this is merely an example. Those of ordinary skill in the art will fully understand that various modifications and other equivalent embodiments can be made from the embodiments. Therefore, the scope of the protection of the technology of the disclosure should be determined by the appended claims and their claims.

Specific technical descriptions in the embodiments are embodiments and do not limit the technical scope of the embodiments. In order to concisely and clearly describe the disclosure, descriptions of general techniques and configurations of the related art may be omitted. In addition, connections or connection members of lines between elements illustrated in the drawings are examples of functional connections and/or physical or circuit connections, and may be represented by various alternative or additional functional connections, physical connections, or circuit connections in an actual device. In addition, unless specifically stated as "essential" or "importantly", an element may not be a necessary element for the application of the disclosure.

The term "above" or similar referring expressions used in the description and claims of the disclosure may refer to both the singular and plural expressions unless otherwise specified. In addition, when a range is described in the embodiments, it indicates that embodiments to which individual values belonging to the range are applied are also included (unless otherwise stated), it is the same as each individual value constituting the range is described in the detailed description of the disclosure. Moreover, steps or operations constituting the method according to the embodiments may be performed in an appropriate order, if the order is explicitly stated or unless otherwise stated. The embodiments are not necessarily limited according to the order of the description of the steps or operations. All examples or illustrative terms (e.g., etc.) in the embodiments are merely used to describe the embodiments in detail, and the scope of the embodiments is limited by the examples or illustrative terms unless limited by the claims. In addition, those of ordinary skill in the art will appreciate that various modifications, combinations, and changes can be made in accordance with design conditions and factors within the scope of the appended claims or equivalents thereof.

It should be understood that embodiments described herein should be considered in a descriptive sense only and not for purposes of limitation. Descriptions of features or aspects within each embodiment should typically be considered as available for other similar features or aspects in other embodiments. While embodiments have been described with reference to the figures, it will be understood by those of ordinary skill in the art that various changes in form and details may be made therein without departing from the spirit and scope included in the following claims and their equivalents.

What is claimed is:

1. A bonding apparatus comprising:

a first wafer supplier comprising a plurality of load ports configured to store wafers having different sizes, the wafers comprising a plurality of substrate wafers and a plurality of die supply wafers;

a first transferer adjacent to the first wafer supplier and configured to transfer the wafers;

a first bonding device and a second bonding device facing the first wafer supplier, and configured to receive the wafers from the first wafer supplier and perform bonding; and a first cleaner comprising a plurality of cleaning areas, each of which is configured to receive the plurality of substrate wafers and the plurality of die supply wafers by the first transferer, and clean the plurality of substrate wafers and the plurality of die supply wafers, wherein each of the first bonding device and the second bonding device comprises:

a bonder configured to bond dies from the plurality of die supply wafers to the plurality of substrate wafers, respectively; and a pre-annealing oven configured to pre-anneal the plurality of bonded substrate wafers, wherein, in each of the first bonding device and the second bonding device, the pre-annealing oven is arranged to be spaced apart from the bonder, and wherein the first transferer is configured to transfer the plurality of pre-annealed substrate wafers to an annealing chamber for secondary annealing.

2. The bonding apparatus of claim 1, wherein the first transferer comprises a first mobile robot and a second mobile robot corresponding to the first bonding device and the second bonding device, respectively, wherein, when a bonder included in the first bonding device performs a bonding process, the second mobile robot is configured to transfer the plurality of substrate wafers to the pre-annealing oven included in the second bonding device, and wherein, when the first mobile robot transfers the plurality of substrate wafers to the pre-annealing oven of the first bonding device, a bonder included in the second bonding device is configured to perform the bonding process.

3. The bonding apparatus of claim 1, further comprising a pretreatment device between the first bonding device and the second bonding device, the pretreatment device being configured to pretreat and activate the plurality of substrate wafers.

4. The bonding apparatus of claim 1, wherein the first wafer supplier is on a first side of the bonding apparatus with respect to the first transferer, and the first bonding device and the second bonding device are on a second side of the bonding apparatus opposite to the first side, wherein the bonding apparatus further comprises a second transferer spaced apart from the first transferer, the second transferer comprising a mobile robot connected to mobile robots included in the first transferer, wherein the first cleaner is on a first side with respect to the second transferer, and wherein the bonding apparatus further comprises a second wafer supplier facing the first cleaner, and comprising a plurality of load ports configured to store the plurality of substrate wafers and the plurality of die supply wafers having different sizes.

5. The bonding apparatus of claim 4, further comprising a pretreatment device adjacent to the first cleaner and facing the second wafer supplier, and configured to pretreat and activate the plurality of bonded substrate wafers.

6. The bonding apparatus of claim 5, wherein the first transferer is configured to transfer the plurality of substrate wafers bonded by the first bonding device and the second bonding device to the second transferer, wherein the second transferer is configured to transfer the plurality of substrate wafers to the pretreatment device and a second cleaner, sequentially perform pretreatment and cleaning, and transfer the plurality of substrate wafers to the first transferer, and wherein the first transferer is configured to stack the plurality of pretreated and cleaned substrate wafers on the first wafer supplier in a plurality of layers.

7. The bonding apparatus of claim 1, wherein the first wafer supplier and the first cleaner are on a first side of the bonding apparatus with respect to the first transferer, wherein the bonding apparatus further comprises a second wafer supplier facing the first wafer supplier with the first cleaner therebetween, the second wafer supplier comprising a plurality of load ports configured to store the plurality of substrate wafers and the plurality of die supply wafers having different sizes, wherein the first bonding device faces the first wafer supplier with respect to the first transferer, and wherein the second bonding device faces the second wafer supplier with respect to the first transferer.

8. The bonding apparatus of claim 7, wherein, in each of the first wafer supplier and the second wafer supplier, a number of load ports configured to store the plurality of die supply wafers is greater than a number of load ports configured to store the plurality of substrate wafers.

9. The bonding apparatus of claim 7, further comprising:

a pretreatment device between the first bonding device and the second bonding device, the pretreatment device being configured to pretreat and activate the plurality of bonded substrate wafers;

a first maintenance area in which the first bonding device is spaced apart from the pretreatment device by a predetermined distance; and a second maintenance area in which the second bonding device is spaced apart from the pretreatment device by a predetermined distance.

10. A bonding apparatus comprising:

a first wafer supplier including a plurality of load ports configured to store wafers having different sizes, the wafers comprising a plurality of substrate wafers and a plurality of die supply wafers;

a first transferer adjacent to the first wafer supplier and configured to transfer the wafers;

a first bonding device and a second bonding device facing the first wafer supplier, and configured to receive the wafers from the first wafer supplier and perform bonding;

a first cleaner comprising a plurality of cleaning areas, each of which is configured to receive the plurality of substrate wafers and the plurality of die supply wafers by the first transferer, and clean the plurality of substrate wafers and the plurality of die supply wafers; and a second wafer supplier facing the first cleaner and comprising a plurality of load ports configured to store the plurality of substrate wafers and the plurality of die supply wafers having different sizes, and wherein each of the first bonding device and the second bonding device comprises:

a bonder configured to bond dies from the plurality of die supply wafers to the plurality of substrate wafers, respectively; and a pre-annealing oven configured to pre-anneal the plurality of bonded substrate wafers, wherein, in each of the first bonding device and the second bonding device, the pre-annealing oven is arranged to be spaced apart from the bonder, and wherein the first transferer is configured to transfer the plurality of pre-annealed substrate wafers to an annealing chamber for secondary annealing.

11. The bonding apparatus of claim 10, wherein the first transferer comprises a first mobile robot and a second mobile robot corresponding to the first bonding device and the second bonding device, respectively, wherein, when a bonder included in the first bonding device performs a bonding process, the second mobile robot is configured to transfer the plurality of substrate wafers to the pre-annealing oven included in the second bonding device, and, wherein, when the first mobile robot transfers the plurality of substrate wafers to the pre-annealing oven of the first bonding device, a bonder included in the second bonding device is configured to perform the bonding process.

12. The bonding apparatus of claim 10, further comprising a pretreatment device between the first bonding device and the second bonding device, the pretreatment device being configured to pretreat and activate the plurality of substrate wafers.

13. The bonding apparatus of claim 10, wherein the first wafer supplier is on a first side of the bonding apparatus with respect to the first transferer, and the first bonding device and the second bonding device are on a second side of the bonding apparatus opposite to the first side, wherein the bonding apparatus further comprises a second transferer spaced apart from the first transferer, the second transferer comprising a mobile robot connected to mobile robots included in the first transferer, and wherein the first cleaner is on a first side with respect to the second transferer.

14. The bonding apparatus of claim 13, further comprising a pretreatment device adjacent to the first cleaner and facing the second wafer supplier, and configured to pretreat and activate the plurality of bonded substrate wafers.

15. The bonding apparatus of claim 14, wherein the first transferer is configured to transfer the plurality of substrate wafers bonded by the first bonding device and the second bonding device to the second transferer, wherein the second transferer is configured to transfer the plurality of substrate wafers to the pretreatment device and a second cleaner, sequentially perform pretreatment and cleaning, and transfer the plurality of substrate wafers to the first transferer, and wherein the first transferer is configured to stack the plurality of pretreated and cleaned substrate wafers on the first wafer supplier in a plurality of layers.

16. The bonding apparatus of claim 10, wherein the first wafer supplier and the first cleaner are on a first side of the bonding apparatus with respect to the first transferer, wherein the first bonding device faces the first wafer supplier with respect to the first transferer, and wherein the second bonding device faces the second wafer supplier with respect to the first transferer.

17. The bonding apparatus of claim 16, wherein, in each of the first wafer supplier and the second wafer supplier, a number of load ports configured to store the plurality of die supply wafers is greater than a number of load ports configured to store the plurality of substrate wafers.

18. The bonding apparatus of claim 16, further comprising:

a pretreatment device between the first bonding device and the second bonding device, the pretreatment device being configured to pretreat and activate the plurality of bonded substrate wafers;

a first maintenance area in which the first bonding device is spaced apart from the pretreatment device by a predetermined distance; and a second maintenance area in which the second bonding device is spaced apart from the pretreatment device by a predetermined distance.

* * * * *